United States Patent [19]

Coleman, Jr. et al.

[11] Patent Number: 4,521,446
[45] Date of Patent: Jun. 4, 1985

[54] METHOD FOR DEPOSITING POLYSILICON OVER TIO$_2$

[75] Inventors: Donald J. Coleman, Jr., Plano; Roger A. Haken, Richardson; Chung S. Wang, Plano, all of Tex.

[73] Assignee: Texas Instruments Incorporated, Dallas, Tex.

[21] Appl. No.: 557,382

[22] Filed: Nov. 30, 1983

Related U.S. Application Data

[63] Continuation of Ser. No. 344,563, Feb. 1, 1982, abandoned.

[51] Int. Cl.$^3$ ............................................. H01L 21/316
[52] U.S. Cl. ........................................ 427/86; 427/96; 427/99; 427/126.3
[58] Field of Search ................... 427/86, 96, 99, 126.3

[56] References Cited

U.S. PATENT DOCUMENTS

| | | | |
|---|---|---|---|
| 3,650,815 | 3/1972 | Ghoshtagore | 427/126.3 |
| 3,916,041 | 10/1975 | Chu | 427/126.3 |
| 4,200,474 | 4/1980 | Morris | 29/571 |
| 4,250,206 | 2/1981 | Bate | 427/126.3 |

*Primary Examiner*—John D. Smith
*Attorney, Agent, or Firm*—Robert Groover, III; Douglas A. Sorensen; James T. Comfort

[57] ABSTRACT

Hydrogen annealing permits deposition of good quality polysilicon atop TiO$_2$. Hydrogen annealing of TiO$_2$ prevents the tremendous hydrogen affinity of as-deposited TiO$_2$ from disrupting process reactions during deposition of polysilicon.

9 Claims, No Drawings

METHOD FOR DEPOSITING POLYSILICON OVER TIO₂

This is a continuation of application Ser. No. 344,563, filed 2-1-82 abandoned.

BACKGROUND OF THE INVENTION

The present invention relates to a method for depositing polysilicon on $TiO_2$.

$TiO_2$ has highly desirable properties as an electronic material, particularly its large dielectric constant. The dielectric constant of crystalline rutile is approximately 125, and as-deposited polycrystalline $TiO_2$ can reliably be formed with a dielectric constant of 100 or better. Moreover, polycrystalline $TiO_2$ has high resistivity, which (for polycrystalline material) can be $10^8$ ohm-cm or better.

Thus, it would be highly desirable to be able to use $TiO_2$ for compact capacitors in integrated circuits. For example, a capacitor one mil square, having a $TiO_2$ dielectric 100 nm thick atop a 10 nm $SiO_2$ layer, would theoretically have a capacitance of 2.2 pF. The advantages of such capacitors are particularly desirable in communications and signal processing IC's.

In addition, $TiO_2$ has the very desirable property that, when applied over a very thin silicon dioxide gate dielectric, the $TiO_2$ tends to "plug" pinhole defects in the oxide, so that the yield rate on, e.g., 10 nm gate dielectrics is greatly increased. Since the dielectric constant of $TiO_2$ is so much larger than that of $SiO_2$, $TiO_2$ is electrically invisible, and the completed device behaves as if it had only a perfect 10 nm oxide in place. Thus, use of $TiO_2$ as an extra layer in MIS gate dielectrics would permit very-high-yield fabrication of gate dielectrics which behaved as if they were very thin (10 nm or less).

For many of these applications, it is necessary or highly desirable to deposit polysilicon on $TiO_2$. For example, the advantages of $TiO_2$ as a gate dielectric are far less attractive if it can only be used with metal gates. However, a difficulty in the prior art has been that, for previously unknown reasons, the quality of polysilicon which is deposited atop $TiO_2$ is very poor ("hazy poly").

It is thus an object of the present invention to provide a method for reliably depositing good-quality polysilicon atop $TiO_2$.

It is a further object of the present invention to provide a method for reliably depositing good-quality polysilicon atop $TiO_2$ without introducing additional layers of material to the device structure being formed.

SUMMARY OF THE INVENTION

The present invention uses hydrogen annealing of as-deposited $TiO_2$ to sate the tremendous hydrogen affinity of the as-deposited material.

According to the present invention, there is provided a method for depositing polysilicon on $TiO_2$, comprising the steps of:
depositing a layer of $TiO_2$;
annealing said $TiO_2$ layer in hydrogen; and
depositing polysilicon on said annealed $TiO_2$.

DESCRIPTION OF THE PREFERRED EMBODIMENTS

Deposition of $TiO_2$, in the presently preferred embodiment, is performed by deposition of titanium metal (e.g. by evaporation), followed by oxidation of the titanium metal. This process reliably yields polycrystalline rutile. ($TiO_2$ has multiple crystalline forms, and rutile is the most desirable, although the others are also useful.) Alternatively, if a high-temperature oxidation step must be avoided, CVD deposition of $TiO_2$ may be used.

After the $TiO_2$ has been formed, it is hydrogen annealed. Preferably, a one hour anneal in forming gas at 620° C. is used. Alternatively, if permitted by safety considerations, a higher concentration of hydrogen would permit a shorter annealing time. Of course, higher temperatures permit shorter annealing times. Maximum temperature is limited by the thermal damage caused to the rest of the circuit elements, and is preferably not more than 1100° C.

Since $TiO_2$ has a tremendous affinity for hydrogen, this hydrogen annealing step saturates the $TiO_2$ with molecular hydrogen, and the "hazy poly" problem is thus avoided. The hazy poly problem is believed to result from depletion of hydrogen from the process gas flow, during the reactions which participate in CVD deposition of polysilicon, by absorption into the $TiO_2$.

The polysilicon is then deposited, doped, patterned, and etched, by conventional methods.

The annealing step can be performed at as low a temperature as 400° C., and for as short a time as 30 minutes (in forming gas), although this is not the presently preferred embodiment, and will not partially attain the advantages discussed above.

Further discussion of the application of the present invention to fabrication of a nonvolatile information storage transistor is found in U.S. Application No. 344,339 filed Feb. 1, 1982 (TI-8830), CMOS Unipolar 4-Transistor 3-Control Line Nonvolatile Memory Cell, of common assignee and simultaneously filed, which is hereby incorporated by reference.

The polysilicon deposition, doping, patterning, and etching all take place according to conventional processes. The key feature of the present invention is the hydrogen anneal of the $TiO_2$ before the polysilicon processing begins. As will be obvious to those skilled in the art, substantial variation in the annealing parameters is possible. In particular, very long annealing times may alternatively be used.

What is claimed is:

1. A method for depositing polysilicon on $TiO_2$, comprising the steps of:
   depositing a layer of $TiO_2$; annealing said $TiO_2$ layer in hydrogen to provide an appropriate surface for the deposition of polysilicon; and
   depositing polysilicon on said annealed $TiO_2$, thereby providing a polysilicon layer which is not hazy.

2. The method of claim 1, wherein said hydrogen annealing step comprises annealing in forming gas.

3. The method of claim 2, wherein said hydrogen annealing step comprises annealing in forming gas for 60 minutes at 620° C.

4. The method of claim 1, wherein said annealing step is performed at at least 400° C.

5. The method of claim 2, wherein said annealing step is performed for at least 30 minutes.

6. The method of claim 4 wherein said annealing step is performed for not less than 60 minutes.

7. The method of claim 5, wherein said annealing step is performed at at least 550° C.

8. The method of claim 1, wherein said annealing step is performed at a temperature between 400° C. and 1100° C.

9. The method of claim 1, wherein said polysilicon deposition step comprises chemical vapor deposition.

* * * * *